United States Patent [19]

Schweitzer, Jr.

[11] 4,263,550
[45] * Apr. 21, 1981

[54] TEST POINT MOUNTED CIRCUIT CONDITION INDICATOR

[76] Inventor: Edmund O. Schweitzer, Jr., 1002 Dundee Rd., Northbrook, Ill. 60118

[*] Notice: The portion of the term of this patent subsequent to Jul. 3, 1996, has been disclaimed.

[21] Appl. No.: 12,155

[22] Filed: Feb. 14, 1979

Related U.S. Application Data

[63] Continuation-in-part of Ser. No. 895,151, Apr. 10, 1978, Pat. No. 4,152,643.

[51] Int. Cl.³ .................. G01R 19/16; G01R 31/02
[52] U.S. Cl. ................................ 324/133; 324/51;
324/120; 324/122; 340/654
[58] Field of Search ............... 324/122, 72.5, 96, 120,
324/133, 149, 51, 119; 174/11 BH, 143;
340/654, 660

[56] References Cited

U.S. PATENT DOCUMENTS

| | | | |
|---|---|---|---|
| 3,390,331 | 6/1968 | Brown et al. | 324/122 |
| 3,524,133 | 8/1970 | Arndt | 324/120 |
| 3,524,178 | 8/1970 | Stratton | 324/133 |

Primary Examiner—Ernest F. Karlsen
Attorney, Agent, or Firm—Lockwood, Dewey, Alex & Cummings

[57] ABSTRACT

Indicating devices for mounting on a test point in an alternating current distribution system provide a visual indication of either voltage level or fault occurrence in the system. The indicating devices are contained in a housing which includes an electrically-conductive rubber outer shell adapted to snap-fit over the test point, and a non-conductive inner housing within which the indicating devices are contained. The indicating devices include a bridge-type rectifier which is coupled to a conductor of the system through the test point terminal, and to ground through the electrically-conductive outer shell. In a voltage indicator application, the rectifier circuit charges a capacitor across which a neon lamp visible through a window in the end of the housing is connected, the rate at which the neon lamp flashes providing an indication of the voltage level on the conductor. In a fault indicator application, the rectifier charges a capacitor which provides current for tripping an indicator flag to a fault-indicating position following a fault, and to a reset position upon restoration of alternating current in the system.

22 Claims, 19 Drawing Figures

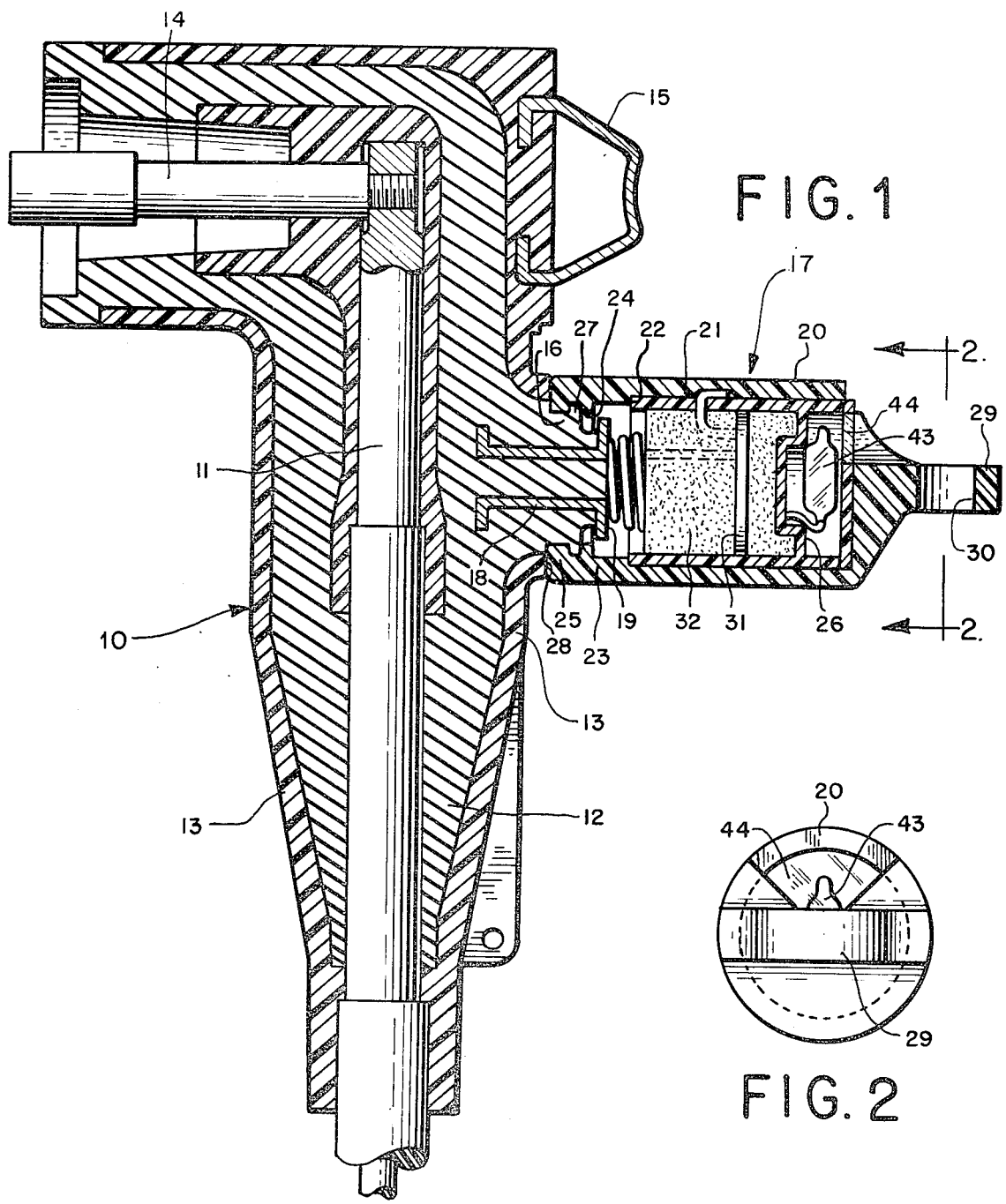

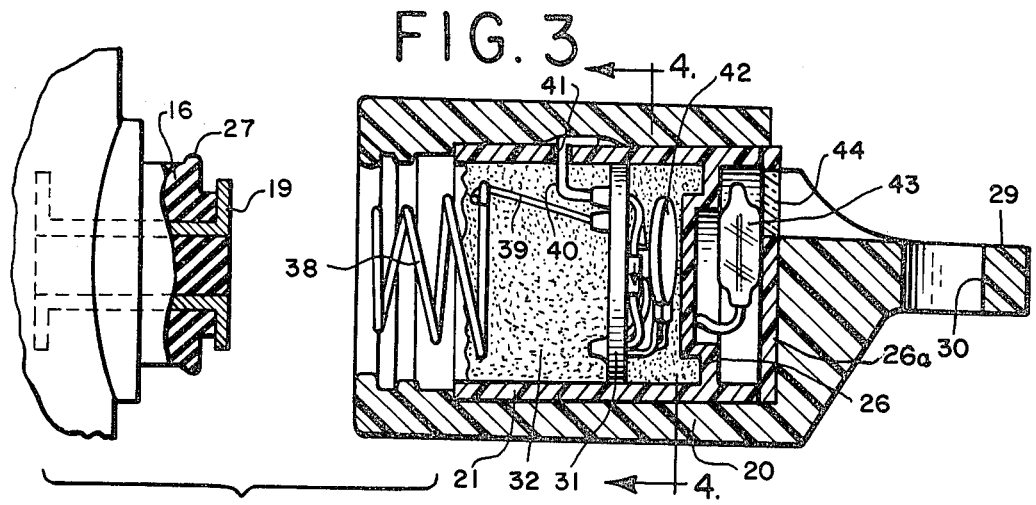
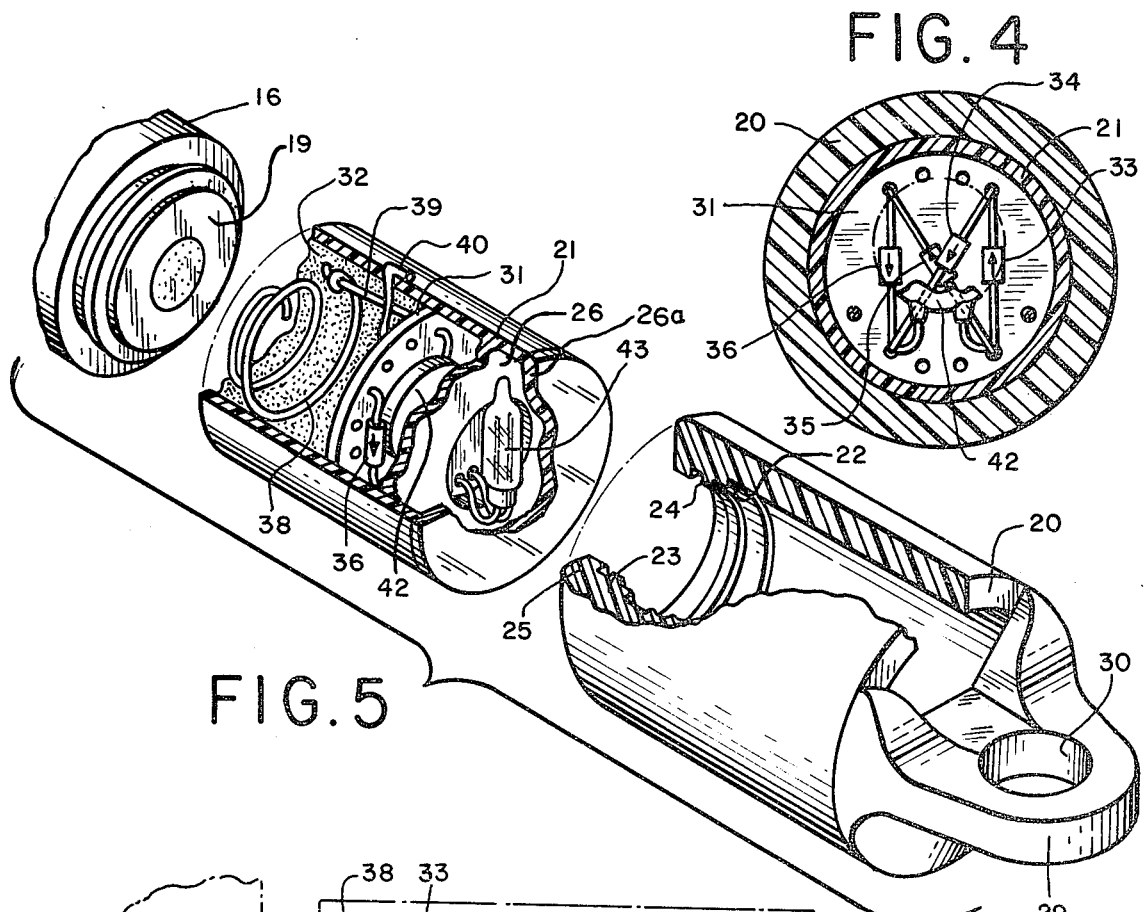
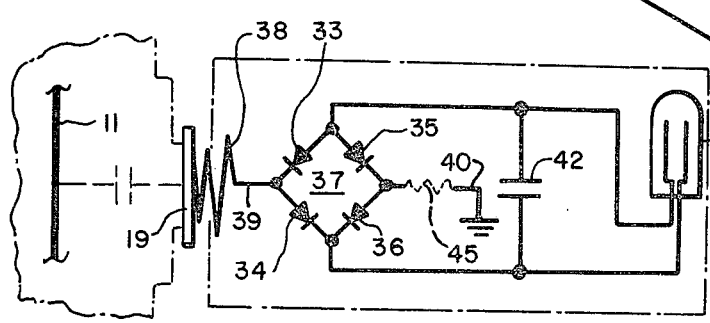

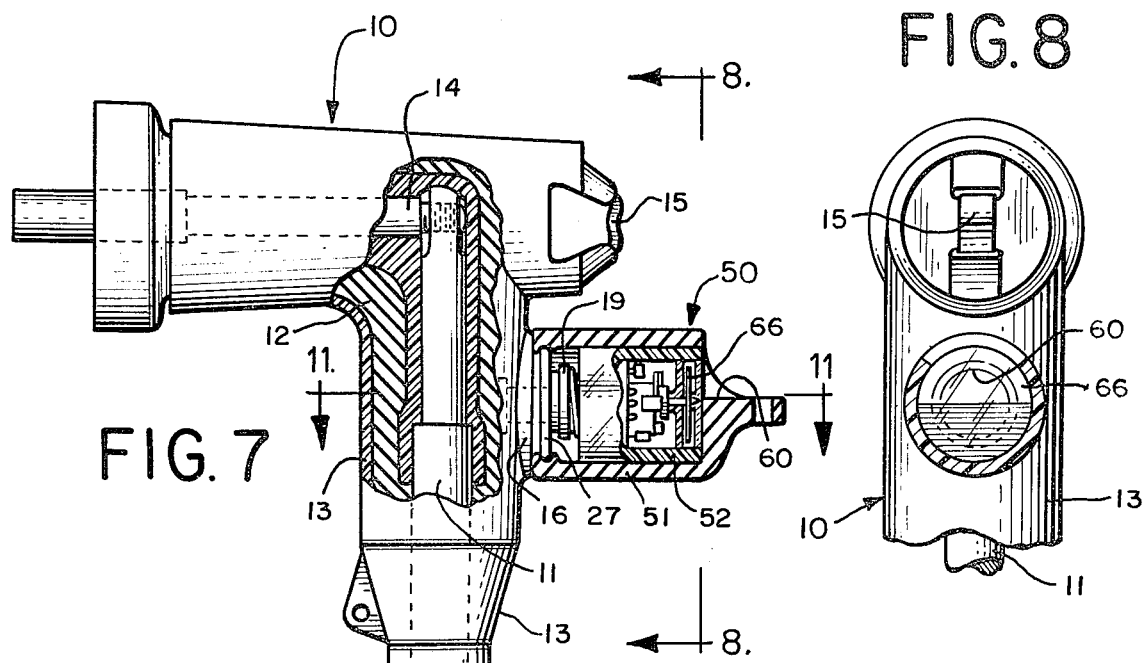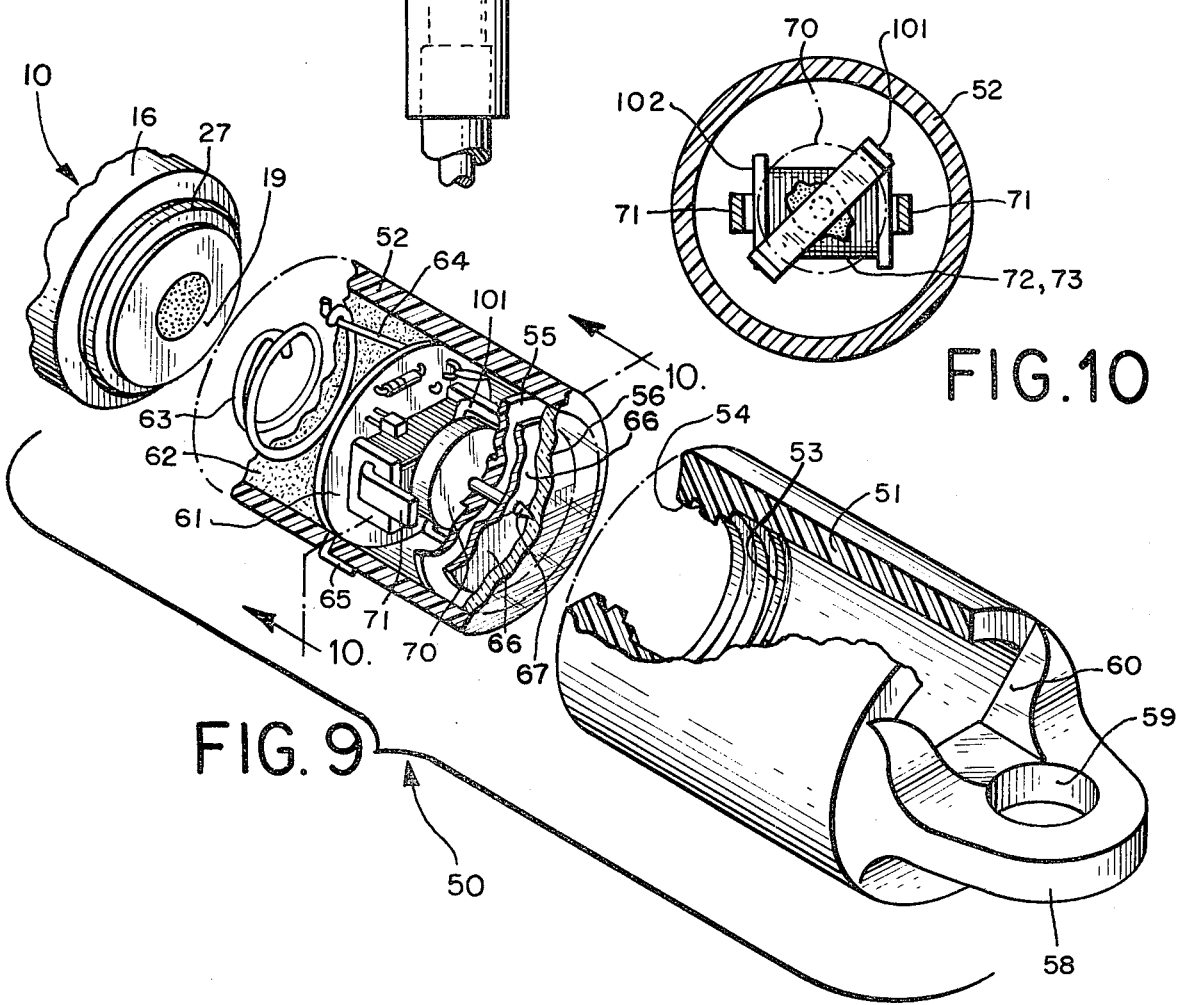

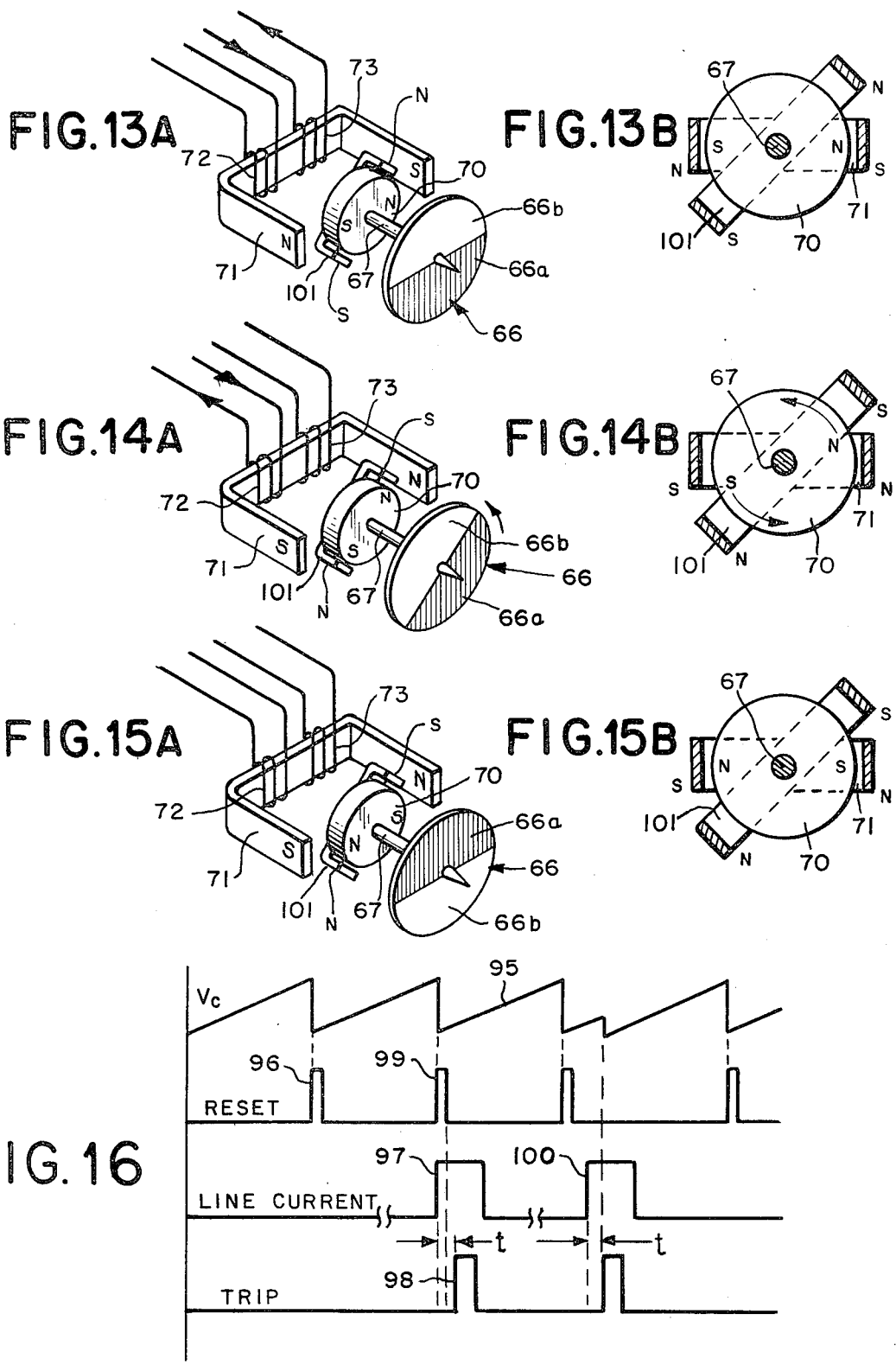

TEST POINT MOUNTED CIRCUIT CONDITION INDICATOR

This application is a continuation-in-part of my application Ser. No. 895,151, filed Apr. 10, 1978, now U.S. Pat. No. 4,152,643, entitled "Voltage Indicating Test Point Cap".

BACKGROUND OF THE INVENTION

The present invention relates generally to circuit condition indicators for use with connectors employed in alternating current high voltage circuits, and more particularly, to indicators contained in a housing which mounts on the test point terminal of an elbow connector or the like to provide a visual indication of voltage level or fault occurrence in such connectors.

Often cables used to carry alternating current at high voltage levels in power generating and distribution systems are connected to transformers and other system components by means of plug-in connectors which snap onto a complementary terminal on the component. Connectors of this type often provide one or more test points for capacitively coupling test or circuit condition indicating devices such as fault indicators to the conductor of the connector. One such test-point mounted fault indicator is disclosed in my U.S. Pat. No. 3,906,477, issued Sept. 16, 1975.

Various types of indicator circuits have heretofore been provided for determining whether the conductor of a connector is energized by a high voltage current. Examples of such indicator circuits may be seen in U.S. Pat. Nos. 3,524,178 and 3,328,690. While such indicator circuits provided means for determining whether the conductor is energized, they did not provide an indication of the voltage level on the conductor. Although apparatus for determining voltage level on a conductor is known, such as that disclosed in U.S. Pat. No. 3,660,575, such apparatus has been unsatisfactory for use in conjunction with connector test points.

The present invention provides fault and voltage circuit condition indicating devices within a novel and economical housing which allows the devices to be readily installed on and removed from conventional test points without danger of shock to the operator and without the need for additional electrical connections to the devices.

It is a general object of the present invention to provide new and improved circuit condition indicating devices, including voltage and fault indicators, which mount to a test point terminal provided on an electrical connector, and which are interchangeable with other indicating devices for performing other types of circuit tests. It is a further general object of the present invention to provide a housing for such circuit condition indicating devices.

SUMMARY OF THE INVENTION

In accordance with this and other objects of the present invention, a circuit condition indicating device is provided which comprises an outer shell of electrically-conductive rubber material having an open end for telescopically mounting to the test point terminal of a connector and a closed end. A circuit condition indicating circuit, which includes a bridge-type full wave rectifier having a capacitor coupled across its output terminals, is mounted within a cylindrical housing concentrically disposed within the outer shell. One input terminal of the rectifier is connected to the test point terminal contact by a helical spring contact at the open end of the shell, and the other input terminal is connected to the outer shell by a conductor extending through an aperture in the tubular housing. When the conductor of the connector is energized by a high voltage alternating current, a corresponding current is induced in the test point contact and coupled to the bridge rectifier via the helical spring contact. The rectified current available at the output terminal of the rectifier charges the capacitor, which provides a unidirectional current for operation of the indicator device.

In a voltage indicating application, when the charge on the capacitor reaches the flash potential of a neon lamp connected across the capacitor, the neon lamp emits a flash of light which is observable through a window in the outer shell. The rate at which the neon lamp flashes as the capacitor is charged and discharged is proportional to the voltage level in the connector, so that by observing the rate of flashing of the neon lamp a determination of the voltage level can be made. In a fault-indicating application, the charge on the capacitor is utilized to position an indicator flag to a tripped position upon occurrence of a fault, or to a reset condition upon restoration of line current.

The test point terminal to which the test point cap is mounted preferably comprises a projection of insulating material protruding through an outer conductive sheath of the connector from an interior insulating member and includes an electrical contact embedded therein which has an exposed portion at the end of the terminal. An inwardly directed annular flange at the open end of the outer shell snaps over an annular rib on the test point terminal to mount the test point cap to the terminal such that the outer shell contacts the grounded sheath.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is an elevational view, partly in section, illustrating a test point mounted circuit condition indicating device in the form of a voltage indicator constructed in accordance with the present invention mounted to the test point terminal of a plug-in elbow connector;

FIG. 2 is a cross-sectional view taken along line 2—2 in FIG. 1;

FIG. 3 is an elevational view, partly in section, showing the voltage indicator disassembled from the connector test point terminal;

FIG. 4 is a sectional view taken along line 4—4 in FIG. 3 showing the circuit components of the voltage indicator mounted on the circuit board in the test point cap;

FIG. 5 is a fragmentary perspective view showing the voltage indicator in a partially disassembled state;

FIG. 6 is a schematic circuit diagram of the voltage indicator;

FIG. 7 is an elevational view, partially in section, illustrating a test point mounted circuit condition indicating device in the form of a resettable test point fault indicator constructed in accordance with the present invention mounted on the test-point terminal of a plug-in terminal connector;

FIG. 8 is a cross-sectional view of the fault indicator and connector taken along line 8—8 in FIG. 7;

FIG. 9 is a fragmentary perspective view of the fault indicator in a partially disassembled state;

FIG. 10 is an enlarged cross-sectional view of the fault indicator taken along line 10—10 in FIG. 9.

FIGS. 13a and 13b are diagrammatic views of the principal components of the fault indicator in a reset state;

FIGS. 14a and 14b are diagrammatic views similar to FIGS. 13a and 13b, respectively, showing the principal components of the fault indicator in transition between a reset state and a tripped state.

FIGS. 15a and 15b are diagrammatic views similar to FIGS. 13a and 13b, respectively, showing the principal components of the fault indicator in a tripped state.

FIG. 16 shows waveforms showing a time delay relationship of the apparatus of FIG. 12.

DESCRIPTION OF THE PREFERRED EMBODIMENT

Figure 11:
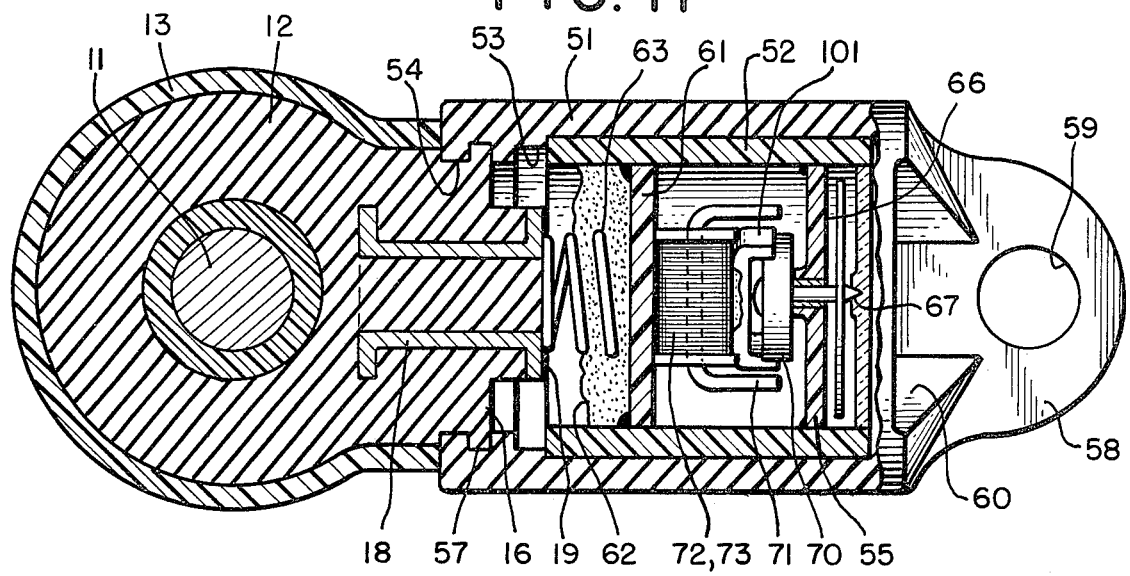
FIG. 11 is an enlarged cross-sectional view taken along line 5—5 in FIG. 1 showing the fault indicator assembled on the test point of the terminal connector.
Figure 12:
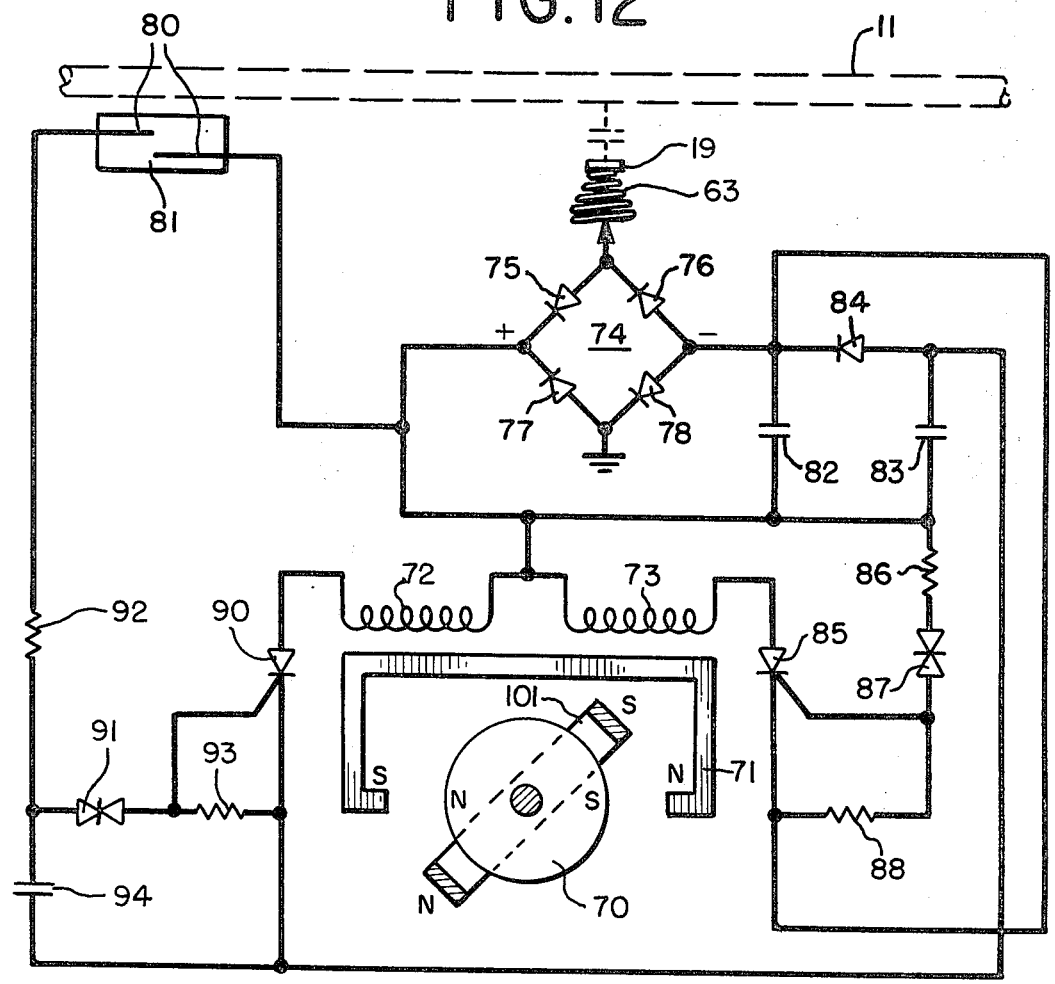
FIG. 12 is an electrical schematic diagram of the fault indicator.

Referring to the drawings, and particularly to FIG. 1, a plug-in elbow connector of conventional construction for use in high voltage alternating current systems for establishing a plug-in connection to a transformer (not shown) or other device is identified generally be reference numeral 10. As shown, the connector 10 includes generally an axial conductor 11 extending through an electrically insulating body portion 12 encased in an electrically-conductive sheath 13, the sheath being grounded in accordance with conventional practice. An electrically-conductive contact member 14, threaded at one end into an aperture in the end of conductor 11, extends from conductor 11 to mate with a complementary contact on the device. An arcuate member 15 having ends anchored in the conductive sheath 13 extends from the connector to receive the hooked end of a tool commonly used to remove plug-in connectors from such devices.

With reference also to FIGS. 3 and 5, elbow connector 10 includes a test point terminal 16 for receiving a circuit condition indicating device, in this case a voltage indicator 17. The test point connector is formed by a portion of the insulating body portion 12, which projects radially through the conductive sheath 13. Embedded in the test point terminal 16 is an electrically conductive contact 18 having an annular outer flange portion 19 which is exposed at the outer end of the terminal to provide an electrical connection to the contact, and an inner portion in proximity to conductor 11 to capacitively couple voltage level indicating circuitry in the voltage indicator 17 to the conductor 11 of the connector.

The housing of the voltage indicator 17 comprises an electrically conductive semi-flexible rubber outer shell 20 which is open at one end for mounting to test point terminal 16. The shell 20 is hollow for receiving a correspondingly sized cylindrical housing 21 in which the electrical components of the voltage indicator device are contained. Housing 21 may be held in position by an annular flange 22 on the inside surface of shell 20. The annular flange 25 extends inwardly at the open end of the outer shell 20 to secure the shell over a test point. The cylindrical housing 21 includes an integral partition 26 which serves as a mask and spacing element; and an end cap 26a which is sonically welded to the end of the housing.

When the voltage indicator 17 is installed on the test point terminal 16, the annular end flange 25 of the outer shell snaps over an exterior annular rib 27 on the terminal and is held in position on the test point terminal 16 by the rib 27 which bears against the interior surface of the end flange 25 of the shell. The interior annular rib 24 of the rubber shell, in turn, bears against the opposite side of the rib 27 to seal the shell 20 to the test point terminal 16. The outer surface of the annular end flange 25 of the shell engages a lip 28 of the connector sheath 13 adjacent the base of the test point terminal to make electrical contact therewith and ground the shell 20. At the closed end of the shell 20, a tab 29 having an aperture 30 therethrough is provided to facilitate the removal of the voltage indicator 17 with a conventional hooked lineman's tool.

In FIGS. 3 through 5, inclusive, a disc-shaped insulator board 31 is shown to be positioned perpendicular to the axis of the housing in a location intermediate the ends thereof and secured in a position by an epoxy material 32 filling the housing. The insulator board 31 serves as a mounting means for the electrical components of the voltage level indicator circuit shown schematically in FIG. 6. There, the circuit is seen to include four diodes 33–36 interconnected in a conventional bridge-type full wave rectifier configuration identified generally by reference numeral 37.

The junction of diodes 33 and 34, a first input terminal of the bridge rectifier, is electrically connected to the test point terminal contact 18 by a helical spring contact 38. At one end, the spring contact 38 is connected, such as by soldering, to a wire conductor 39 extending in the cylindrical housing 21 from the junction of diodes 33 and 34 through a perforation in the insulator board 31. When the test point cap 17 is installed on the test point terminal 16, the spring contact 38 is resiliently pressed against the annular flange 19 of the terminal contact to effect the connection between the test point terminal contact and the voltage level indicator circuit. The junction of diodes 35 and 36, which comprises the other input terminal of the bridge rectifier, is grounded by a wire conductor 40. In particular, the conductor 40 extends through a perforation in the insulator board 31, where it is soldered to the rectifier bridge 37, and an aperture 41 in the wall of the tubular housing 21. There, the other end of the wire conductor 40 is compressively wedged between the cylindrical housing 21 and the outer shell 20 such that the connection to ground is completed through the electrically conductive outer shell to the grounded connector sheath 13.

When the conductor 11 in the connector is energized by a high voltage alternating current, a corresponding alternating current is capacitively induced in the test point terminal contact 18. The induced current is coupled through the helical spring contact 38 and the wire conductor 39 to the full wave rectifier bridge 37 which, in turn, rectifies the induced current to charge a capacitor 42 connected across the output terminals of the bridge rectifier, between the junction of diodes 33 and 35 and the junction of diodes 34 and 36.

To provide an indication of the voltage level on conductor 11, a neon lamp 43 is connected across capacitor 42 and positioned in the space between the closed end of outer shell 20 and mask 26, with its lead wire extending through the mask to connect to capacitor 42 and rectifier bridge 37 at insulator board 31. As illustrated in FIG. 2, the neon lamp 43 is positioned by means of mask 26 in substantial alignment with a transparent window 44 in the end wall of the shell and can be observed from a vantage point external to the test point cap. As capacitor 42 is charged by the unidirectional current developed by the bridge rectifier, the voltage level across the capacitor increases. Eventually, the charge on the capacitor reaches the flash threshhold of the neon lamp, and the lamp emits a flash of light as it discharges the capacitor. Since the voltage developed by the rectifier is proportional to the voltage level on connector 11, and since the capacitor is charged at a rate which is proportional to the output voltage level of the rectifier, by observing the rate at which the neon lamp 43 flashes a determination of the voltage level on the conductor 11 can be made.

While the use of neon lamp 43 has been shown in the illustrated embodiment, it will be appreciated that other light emitting discharge devices, such as light emitting diodes, could be used instead with appropriate adjustment of circuit parameters. Furthermore, a half-wave rectifier circuit can be substituted for the full-wave circuit illustrated where slower charging rates for capacitor 42 can be tolerated.

To provide for calibration of the voltage indicator, i.e., to obtain a specific flashing rate for a particular voltage on conductor 11, a calibration resistor 45 may optionally be provided in series with one of the input terminals of rectifier network 37. This resistor may either be provided in lead 40, as shown in FIG. 6, or in lead 39. In either case, the resistor functions to adjust the charging rate of capacitor 42 to obtain the desired flashing rate.

In one successful commercial embodiment of the invention for use on electrical circuits operating within a range of 2.5–34 kilovolts, the following components were utilized:
Diodes 33–36 Type 1N4007
Capacitor 42 0.1 mfd ceramic 100 V
Neon lamp 43 NE211
With this circuit a 5.0 kilovolt line voltage provided a flashing rate of one per second, and a 10.0 kilovolt line voltage provided a flashing rate of two per second.

The housing of the voltage indicating device includes an outer shell 20 constructed of an electrically-conductive elastomeric compound with a length of approximately 4.0 inches, an outside diameter of approximately 2.0 inches, and an opening of approximately 1.25 inches. The cylindrical housing 21 was constructed of a transparent Lexan (a trademark of the General Electric Company) polycarbonate material with a length of approximately 1.75 inches, an outside diameter of approximately 1.5 inches, and a wall thickness of approximately 0.125 inch. The insulator board 31 was constructed of a phenolic material and the mask member 26 was formed integrally with housing 21. In practice, the actual dimensions and materials used may vary with the particular application.

The same housing may be utilized to house other test point mounted circuit condition indicating devices, such as fault indicators. Referring to FIGS. 7–16, a fault indicator 50 constructed in accordance with the invention is shown in conjunction with the previously described plug-in terminal connector.

The housing of fault indicator 50 is identical to that of the voltage-indicating device, comprising an electrically conductive hollow rubber outer shell 51 which is open at one end for mounting to the test-point terminal 16. A correspondingly sized cylindrical transparent plastic housing 52 containing the electrical components of the fault indicator circuit is contained within the rubber outer shell, and held in position within the shell by an annular flange portion 53 on the inside surface of the shell. The annular flange portion also extends inwardly at the open end of the shell to form a rim portion 54 which secures the shell over the test-point. The cylindrical housing 52 includes an integral partition 55 which serves as a mask and spacing element, and a transparent end cap portion 56 which is sonically welded to the end of the housing.

When the fault indicator 50 is installed on the test-point terminal 16 the annular end flange portion 54 of the outer shell snaps over an annular rib portion 57 on the terminal. The outer surface of the annular end flange 54 engages the electrically-conductive connector sheath 13 to establish an electrical ground for shell 51. At the closed end of the shell a tab portion 58 having an aperture 59 therein is provided to facilitate the removal of the test-point cap with a conventional hooked lineman's tool. A window 60 in the end of the outer shell allows the end of housing 52 to be viewed.

Referring to FIGS. 3 and 5, a disc-shaped insulator board 61 is positioned perpendicular to the axis of the housing in a location intermediate the ends thereof. The insulator board, which may be secured in position by an epoxy material 62 filling the housing, serves as mounting means for the electrical components of the fault indicator circuitry. An electrical connection is established between this circuitry and test point contact 19 by means of a helical spring 63, the spring being connected to a wire conductor 64 extending from the circuit board at one end, and being resiliently pressed against contact 19 at its other end. An electrical ground connection is established to the circuit board by means of an additional electrical conductor 65 compressively wedged between housing 52 and the electrically conductive grounded outer shell 51.

To provide an indication of the occurrence of a fault current in conductor 11, the fault indicator includes within the lower end of housing 52 a disc-shaped target 66 which is mounted for rotation on a pivot 67. The face of the target disc has a red segment 66a and a white segment 66b, only one of which is visible at a time through window 60 and the transparent end of housing 52.

Secured to and pivotal with target 66 is a target permanent magnet 70 which is formed of a magnetic material having a high coercive force, such as ceramic, and is magnetically polarized to form two magnetic poles of opposite gender, as indicated in FIGS. 13–15, with opposite magnetic polarities along a diameter of the magnet. The targe disc 66 and its permanent magnet 70 are biased to the position shown in FIGS. 13a and 13b when the fault indicator is in a non-tripped or reset condition by means of a stationary generally U-shaped magnetic pole piece 71 which is located within housing 52 generally co-planar with the axis of rotation of target disc 66.

The pole piece 71, which is preferably formed of a magnetic material having a relatively low coercive force, such as a chrome steel, is biased at its projecting ends to the magnetic polarities indicated in FIGS. 13a and 13b. As shown in FIGS. 9 and 11, the ends of the pole piece extend along the side wall of housing 52, in close proximity to target magnet 70. As a result, the opposite polarity magnetic poles of the target magnet are attracted to position the target disc 66 as shown. In this position the red segment 66a of the target disc is not visible through window 60, and all that is seen is the white segment 66b.

On the occurrence of a fault current in conductor 11, which may, for example, exceed 400 amperes, pole piece 71 is remagnetized to the magnetic polarities shown in FIGS. 14 and 15 by momentary energization of a trip winding 72 on the center section of the pole piece. As a result, the poles of magnet 70 are repelled by the adjacent like-gender poles of the pole piece and the target disc is caused to rotate 180° to the tripped position shown in FIGS. 15a and 15b. In this position, the red segment 66b of the target disc is visible through window 60, and a lineman viewing the fault indicator is advised that a fault current has flowed through conductor 11.

The target disc remains in the fault indicating position until the ends of the pole piece 71 are subsequently re-magnetized to the magnetic polarities shown in FIGS. 13a and 13b by momentary energization of a reset winding 73 on the center section of the pole piece. As a result, the target magnet 70, and hence the target disc 66, are caused to rotate from the tripped position shown in FIGS. 15a and 15b to the reset position shown in FIGS. 13a and 13b, and the fault indicator is conditioned to respond to a subsequent fault current.

Energization of winding 73 upon occurrence of a fault current in conductor 11, and energization of winding 72 upon restoration of current in conductor 11 following a fault, is accomplished by means of externally-powered circuitry contained within the fault indicator. Referring to the schematic diagram shown in FIG. 12, windings 72 and 73 are connected end-to-end for independent energization upon occurrence of fault and reset conditions, respectively. Operating power for these windings is obtained by means of a bridge rectifier network 74, consisting of diodes 75–78. One input terminal of this network, formed at the juncture of the anode of diode 75 and the cathode of diode 76, is connected through the helical spring 63 to test-point contact 19. The other input terminal, formed at the anode of diode 77 and the cathode of diode 78, is connected to ground through the electrically conductive sheath 51 of the fault indicator housing. With this arrangement, high voltage alternating current carried in conductor 11 is capacitively coupled to the bridge rectifier network, resulting in the production of a pulsating unidirectional current at the output terminals of the network.

The positive polarity output terminal of the bridge rectifier network, formed at the cathodes of diodes 75 and 77, is connected to one contact 80 of a reed switch 81, to the commonly-connected end terminals of windings 72 and 73, and to respective terminals of capacitors 82 and 83. The negative polarity output terminal of the bridge rectifier network, formed at the juncture of the anodes of diodes 76 and 78, is connected directly to the remaining terminal of capacitor 82, and through a forward-biased diode 84 to the remaining terminal of capacitor 83. With this arrangement, capacitors 82 and 83 are charged by the pulsating unidirectional current developed by bridge rectifier network 74 during normal current flow in conductor 11.

To provide for periodic energization of reset winding 73 during normal current flow in conductor 11, the remaining end terminal of winding 73 is connected through a silicon controlled rectifier (SCR) 85 to the negative polarity terminal of capacitor 82. Periodic conduction through SCR 85 is obtained by connecting the gate electrode of that device to the positive polarity output terminal of bridge rectifier network 74 through a resistor 86 and a bilateral diode 87, and to the cathode of SCR 85 through a resistor 88. With this arrangement, SCR 85 is periodically triggered into conduction when the voltage developed across bilateral diode 87 as a result of capacitor 82 being charged by bridge rectifier 74 reaches the threshold level of the bilateral diode.

In operation, under normal current flow conditions, the voltage developed across capacitor 82 as the capacitor is charged by bridge rectifier network 74 progressively increases with time, until the threshold breakdown voltage of bilateral diode 87 is reached, at which time SCR 85 is triggered and capacitor 82 discharges through winding 73. Diode 84 prevents capacitor 83 from being discharged through SCR 85 and winding 73, leaving the capacitor available for energizing winding 72 in response to a fault condition. In practice, the breakdown voltage of bilateral diode 87 may be in the order of 34 volts, and the time required for capacitor 82 to reach this threshold level with a typical voltage level of 4,400 volts on conductor 11 may be approximately 2 minutes. In any case, the voltage level within conductor 11 is not critical to the operation of the reset circuit, and has only the effect of changing the repetition rate of the reset cycle.

Trip winding 72 is energized upon occurrence of a fault current in conductor 11 by discharge of capacitor 83 through a second silicon controlled rectifier 90. Conduction is established through SCR 90 by closure of the contacts 80 of reed switch 81, which is positioned within housing 52 in close proximity to conductor 11 such that the alternating magnetic field produced in the vicinity of conductor 11 upon generator of a fault current is sufficient to close the contacts of the reed switch. The gate electrode of SCR 90 is connected through a bilateral diode 91 and a resistor 92 to the remaining contact of reed switch 81, and through a resistor 93 to the SCR cathode. The juncture of resistor 92 and bilateral diode 91 is connected by a capacitor 94 to capacitor 83.

Upon occurrence of a fault current in conductor 11, the positive polarity output terminal of bridge rectifier network 74 is connected through the closed contacts of reed switch 81 and the circuit comprising resistor 92, bilateral diode 91, resistor 93 and capacitor 94 to the gate electrode of SCR 90, causing that device to be rendered conductive following a predetermined time delay. At this time capacitors 82 and 83 are caused to discharge through SCR 90 and energize winding 72. The resulting magnetic flux in the U-shaped pole piece 71 reverses the magnetic pole polarities of the pole piece and causes rotation of the target as previously described.

To preclude the possibility of windings 72 and 73 being simultaneously actuated by simultaneous conduction through SCR 90 and SCR 85, a predetermined time delay in conduction through SCR 90 is provided following occurrence of a fault current in conductor 11. This is accomplished by resistor 92 and capacitor 94 which together form an RC time constant network in the gate circuit of SCR 90. Upon closure of the contacts of reed switch 81 it is necessary that capacitor 94 charge through resistor 92 to the threshold voltage of bilateral diode 91 before sufficient gate electrode current is supplied to SCR 90 to initiate conduction in that device.

The actual time delay provided is determined by the resistance of resistor 92, the capacitance of capacitor 94, the threshold voltage of bilateral diode 91, and the voltage level developed across capacitor 83, and is designed to insure that should a fault occur simultaneously with the periodic energization of winding 73, capacitor 82 will have completely discharged through that winding prior to winding 72 being energized to signal the fault. In practice, with a 36 volt voltage level across capacitor 83 and a 20 volt threshold voltage level for bilateral diode 91, the time delay may be in the order of 180 microseconds, with a resistor 92 of 1800 ohms and a capacitor 94 of 0.1 microfarads.

The time delay relationship can be seen by referring to the waveforms illustrated in FIG. 16. Under normal line current conditions it is seen that the voltage Vc developed across capacitor 82 and depicted by waveform 95 progressively increases until the threshold level of bilateral diode 92 is reached, at which time SCR 85 is rendered conductive and a reset current depicted by waveform 96 is repetitively caused to flow through reset winding 73.

Upon occurrence of a fault current in conductor 11, as depicted by waveform 97, trip winding 72 is energized after a delay interval t, as shown by waveform 98. Should the fault current occur simultaneously with a reset pulse, as shown by waveform 99, capacitor 82 will have completely discharged through winding 73 prior to the winding 72 being energized, as a result of the time period t. If it were not for this delay period, windings 72 and 73 would be simultaneously energized, resulting in the production of opposing magnetic fields in pole piece 71 and raising the possibility of rotor 66 not responding to the fault. Typically, the reset current pulses applied to windings 72 and 73 have a duration of approximately 20 microseconds, and fault currents existing in conductor 11 have a duration of one quarter cycle, or approximately four miliseconds in a 60 hertz system.

Should a fault occur before the reset pulse, as illustrated by waveform 100, the then occuring reset cycle will be interrupted by discharge of capacitor 82 through diode 84 and SCR 90 so that no possibility exists of a reset pulse occuring simultaneously with the ensueing delayed reset pulse. Upon discharge of capacitors 82 and 83 through winding 72, the reset cycle begins anew as SCR 90 again becomes non-conductive.

Referring to FIGS. 10 and 13-15, to avoid any possibility of rotor 66 becoming stalled upon reversal of the magnetic polarities of pole piece 71, as might happen with a rotor being perfectly centered between the poles of pole piece 71 and having a degree of bearing friction, an auxiliary U-shaped pole piece 101 is positioned adjacent target magnet 70 coaxial with and at an angle to pole piece 71 by means of epoxy 102 or other appropriate fastening means.

For reasons well known to the art, the existence of a magnetic field between the poles of pole piece 71 results in the production of induced magnetic poles on auxiliary pole piece 101 of opposite gender to the most adjacent poles of pole piece 71. This is illustrated in FIGS. 13-15, and results by reason of the auxiliary pole piece 101 becoming included in the magnetic flux path between the poles of pole piece 71.

The effect of the magnetic poles induced in auxiliary pole piece 101 is that upon reversal of the gender of the poles of pole piece 71 following occurrence of a fault current the auxiliary poles exert a rotational force on the most adjacent poles of the target 70. This results in a rotational movement being exerted on target 66, tending to turn the target in a predetermined (counterclockwise in FIGS. 13-15) direction such that the target is precluded from remaining in its reset position, even if it should be perfectly positioned and have a degree of bearing friction. Once rotation has been established, as shown in FIGS. 14a and 14b, the greater force of the main pole piece 71 overcomes the effect of the auxiliary pole piece 101 and rotation continues until the target is aligned as shown in FIGS. 15a and 15b.

While particular embodiment of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A circuit condition indicator device for mounting to the test point terminal of a connector employed in a high-voltage system wherein the connector includes a conductor embedded in an insulating member encased in a conductive sheath referenced to ground, and wherein the test point terminal includes a projection of the insulating member extending through the conductive sheath and having an electrically conductive test point contact embedded in the insulating member, the test point contact having an exposed portion at the outer end of the test point terminal, alternating current in the conductor capacitively inducing a proportional alternating current at the test point contact for powering said device, said device comprising, in combination:

circuit means including a rectifier having input terminals and output terminals and a viewable circuit condition indicator;

means including an electrically-conductive outer shell having an open end for mounting to said test point terminal and a closed end, and a window, said outer shell contacting said grounded connector sheath when said test point cap is mounted on said test point terminal;

a cylindrical housing telescopingly disposed within said outer shell, at least the portion of said housing adjacent said window being transparent;

said circuit condition indicator being located within said cylindrical housing in substantial alignment with said window;

an electrically conductive spring contact disposed within said cylindrical housing, said spring contact having one end connected to one of said input terminals of said rectifier and its other end disposed for engaging said exposed portion of said test point contact;

the other one of said input terminals of said rectifier being coupled to said outer shell to reference said rectifier to ground;

said induced current being coupled to said rectifier by said contact and rectified by said rectifier to charge said capacitor and energize said circuit condition indicator, said indicator being visible through said window to indicate circuit status.

2. A circuit condition indicator in accordance with claim 1 wherein said test point terminal includes an annular rib extending around said projection adjacent said outer end thereof and wherein said outer shell includes an inwardly directed annular flange at said open end, said flange snapping over said rib and having an interior surface bearing against said rib to releasably secure said test point cap to said test point terminal.

3. A circuit condition indicator in accordance with claim 2 wherein said end flange includes an exterior surface which contacts said sheath to ground said outer shell when said test point cap is mounted to said test point terminal.

4. A circuit condition indicator in accordance with claim 1 wherein said cylindrical housing includes an aperture, and wherein said cap includes a wire conductor having one end connected to said other of said bridge rectifier input terminals and another end extending through said aperture, said other end of said wire conductor being compressively wedged between said outer shell and said cylindrical housing to effect an electrical connection to said outer shell.

5. A circuit condition indicator in accordance with claim 1 wherein said spring contact comprises an electrically conductive helical spring contact substantially coaxially disposed within said cylindrical housing.

6. A circuit condition indicator in accordance with claim 5 including an epoxy material filling said cylindrical housing.

7. A circuit condition indicator in accordance with claim 1 wherein said outer shell includes a tab extending from said closed end, said tab having an aperture therethrough for receiving a tool for removing said test point cap from said test point terminal.

8. A housing for a circuit condition indicator for mounting to the test point terminal of a connector employed in a high-voltage system wherein the connector includes a conductor embedded in an insulating member encased in a conductive sheath referenced to ground, and wherein the test point terminal includes a projection of the insulating member extending through the conductive sheath and having an electrically conductive test point contact embedded in the insulating member, the test point contact having an exposed portion at the outer end of the test point terminal, alternating current in the conductor capacitively inducing a proportional alternating current at the test point contact, said circuit condition indicator device being operable from said induced alternating current applied to first and second input terminals of said device, said housing assembly comprising, in combination:
an electrically conductive outer shell having an open end for mounting to the test point terminal and a closed end, said outer shell contacting said grounded connector sheath when said shell is mounted on said test point terminal;
a cylindrical housing telescopingly disposed within said outer shell and containing the circuit condition indicator;
an electrically conductive spring contact disposed within said cylindrical housing, said spring contact having one end connected to one of said input terminals of said circuit condition indicator and its other end disposed for engaging said exposed portion of said test point contact;
the other one of said input terminals of said circuit condition indicator device being coupled to said outer shell to reference said device to ground, whereby said circuit condition indicator device is powered by said induced current upon energization of said conductor.

9. A housing for a circuit condition indicator in accordance with claim 8 wherein said test point terminal includes an annular rib extending around said projection adjacent said outer end thereof and wherein said outer shell includes an inwardly directed annular flange at said open end, said flange snapping over said rib and having an interior surface bearing against said rib to releasably secure said housing to said test point terminal.

10. A housing for a circuit condition indicator in accordance with claim 9 wherein said end flange includes an exterior surface which contacts said sheath to ground said outer shell when said housing is mounted to said test point terminal.

11. A housing for a circuit condition indicator in accordance with claim 8 wherein said cylindrical housing includes an aperture, and wherein said housing includes a wire conductor having one end connected to said other of said input terminals and another end extending through said aperture, said other end of said wire conductor being compressively wedged between said outer shell and said cylindrical housing to effect an electrical connection to said outer shell.

12. A housing for a circuit condition indicator in accordance with claim 8 wherein said spring contact comprises an electrically conductive helical spring contact substantially coaxially disposed within said cylindrical housing.

13. A housing for a circuit condition indicator in accordance with claim 12 including an epoxy material filling said cylindrical housing.

14. A housing for a circuit condition indicator in accordance with claim 8 wherein said outer shell includes a tab extending from said closed end, said tab having an aperture therethrough for receiving a tool for removing said housing assembly from said test point terminal.

15. A housing for a circuit condition indicator in accordance with claim 8 wherein said circuit condition indicator includes visual indicating means, said outer shell includes a window, at least a portion of said cylindrical housing adjacent said window is transparent, and said visual indicating means are disposed within said cylindrical housing and viewable from the exterior of the housing through said window.

16. A fault indicator for mounting to the test point terminal of a connector employed in a high-voltage system wherein the connector includes a conductor embedded in an insulating member encased in a conductive sheath referenced to ground, and wherein the test point terminal includes a projection of the insulating member extending through the conductive sheath and having an electrically conductive test point contact embedded in the insulating member, the test point contact having an exposed portion at the outer end of the test point terminal, alternating current in the conductor capacitively inducing a proportional alternating current at the test point contact for powering said indicator, said fault indicator comprising in combination:
circuit means including a rectifier having input terminals and output terminals;
said circuit means including a capacitor coupled across said output terminals, and a visual fault indicating device coupled across said capacitor;

means including an electrically conductive outer shell having an open end for mounting to said test point terminal and a closed end, and a window, said outer shell contacting said grounded connector sheath when said test point cap is mounted on said test point terminal;

a cylindrical housing telescopingly disposed within said outer shell, at least the portion of said housing adjacent said window being transparent;

said fault indicating device being located within said cylindrical housing in substantial alignment with said window;

an electrically conductive spring contact disposed within said cylindrical housing, said spring contact having one end connected to one of said input terminals of said rectifier and its other end disposed for engaging said exposed portion of said test point contact;

the other one of said input terminals of said rectifier being coupled to said outer shell to reference said rectifier to ground, said induced current being coupled to said rectifier by said contact and rectified by said rectifier to charge said capacitor and energize said fault indicator, said fault indicator being visible through said window upon occurrence of a fault in said conductor.

17. A fault indicator in accordance with claim 16 wherein said test point terminal includes an annular rib extending around said projection adjacent said outer end thereof and wherein said outer shell includes an inwardly directed annular flange at said open end, said flange snapping over said rib and having an interior surface bearing against said rib to releasably secure said test point cap to said test point terminal.

18. A fault indicator in accordance with claim 17 wherein said end flange includes an exterior surface which contacts said sheath to ground said outer shell when said test point cap is mounted to said test point terminal.

19. A fault indicator in accordance with claim 16 wherein said cylindrical housing includes an aperture, and wherein said cap includes a wire conductor having one end connected to said other of said bridge rectifier input terminals and another end extending through said aperture, said other end of said wire conductor being compressively wedged between said outer shell and said cylindrical housing to effect an electrical connection to said outer shell.

20. A fault indicator in accordance with claim 16 wherein said spring contact comprises an electrically conductive helical spring contact substantially coaxially disposed within said cylindrical housing.

21. A fault indicator in accordance with claim 20 including an epoxy material filling said cylindrical housing.

22. A fault indicator in accordance with claim 16 wherein said outer shell includes a tab extending from said closed end, said tab having an aperture therethrough for receiving a tool for removing said test point cap from said test point terminal.

* * * * *

UNITED STATES PATENT AND TRADEMARK OFFICE
CERTIFICATE OF CORRECTION

PATENT NO. : 4,263,550
DATED : April 21, 1981
INVENTOR(S) : Edmund O. Schweitzer, Jr.

It is certified that error appears in the above-identified patent and that said Letters Patent are hereby corrected as shown below:

Col. 1, line 36: Change "althrough" to --Although--.
        line 39: Change "3,660,575" to --3,660,757--.

Col. 3, line 33: Change "be" to --by--.

Col. 4, line 17: After "terminal" insert --16--.
        line 26: After "in" delete "a".

Col. 5, line 23: After "of" insert --a--.

Col. 6, line 60: Change "targe" to --target--.

Col. 8, line 42: Change "generator" to --generation--.

Col. 9, line 36: After "to" delete "the".
        line 44: Change "miliseconds" to --milliseconds--.
        line 50: Change "occuring" to --occurring--.

Col. 10, line 18: Change "embodiment" to --embodiments--.

Signed and Sealed this

Eighteenth Day of August 1981

[SEAL]

Attest:

GERALD J. MOSSINGHOFF

*Attesting Officer*     *Commissioner of Patents and Trademarks*